United States Patent [19]
Tsukikawa

[11] Patent Number: 5,995,427
[45] Date of Patent: Nov. 30, 1999

[54] SEMICONDUCTOR MEMORY DEVICE HAVING TEST MODE

[75] Inventor: Yasuhiko Tsukikawa, Hyogo, Japan

[73] Assignee: Mitsubishi Denki Kabushiki Kaisha, Tokyo, Japan

[21] Appl. No.: 08/985,219

[22] Filed: Dec. 4, 1997

[30] Foreign Application Priority Data

Jun. 10, 1997 [JP] Japan ..................................... 9-152196

[51] Int. Cl.⁶ ................................................. G11C 7/00
[52] U.S. Cl. ........................... 365/201; 365/203; 365/226
[58] Field of Search ..................................... 365/201, 203, 365/226

[56] References Cited

U.S. PATENT DOCUMENTS

| | | | |
|---|---|---|---|
| 5,544,108 | 8/1996 | Thomann | 365/201 |
| 5,659,512 | 8/1997 | Koyanagi et al. | 365/203 |
| 5,717,652 | 2/1998 | Ooishi | 365/201 |
| 5,761,141 | 6/1998 | Kabashi et al. | 365/201 |
| 5,793,686 | 8/1998 | Furutani et al. | 365/201 |
| 5,815,451 | 9/1998 | Tsuchida | 365/203 |

OTHER PUBLICATIONS

"Wafer Burn–in(WBI) Technology for High Density DRAM" H.Noji et al., Technical Report of IEICE. SDM94–22, ICD94–33(1994–05), pp. 41–46.

Primary Examiner—David Nelms
Assistant Examiner—Gene N. Auduong
Attorney, Agent, or Firm—McDermott, Will & Emery

[57] ABSTRACT

In a DRAM, a bit-line potential inputting node of an equalizer provided for each odd-numbered pair of bit lines is provided separately from a bit-line potential inputting node of an equalizer provided for each even-numbered pair of bit lines. In burn-in testing, one node receives a high level and the other node receives a low level to simultaneously apply electric field stress between adjacent pairs of bit lines. This allows sufficient acceleration of initial failures in burn-in testing.

10 Claims, 14 Drawing Sheets

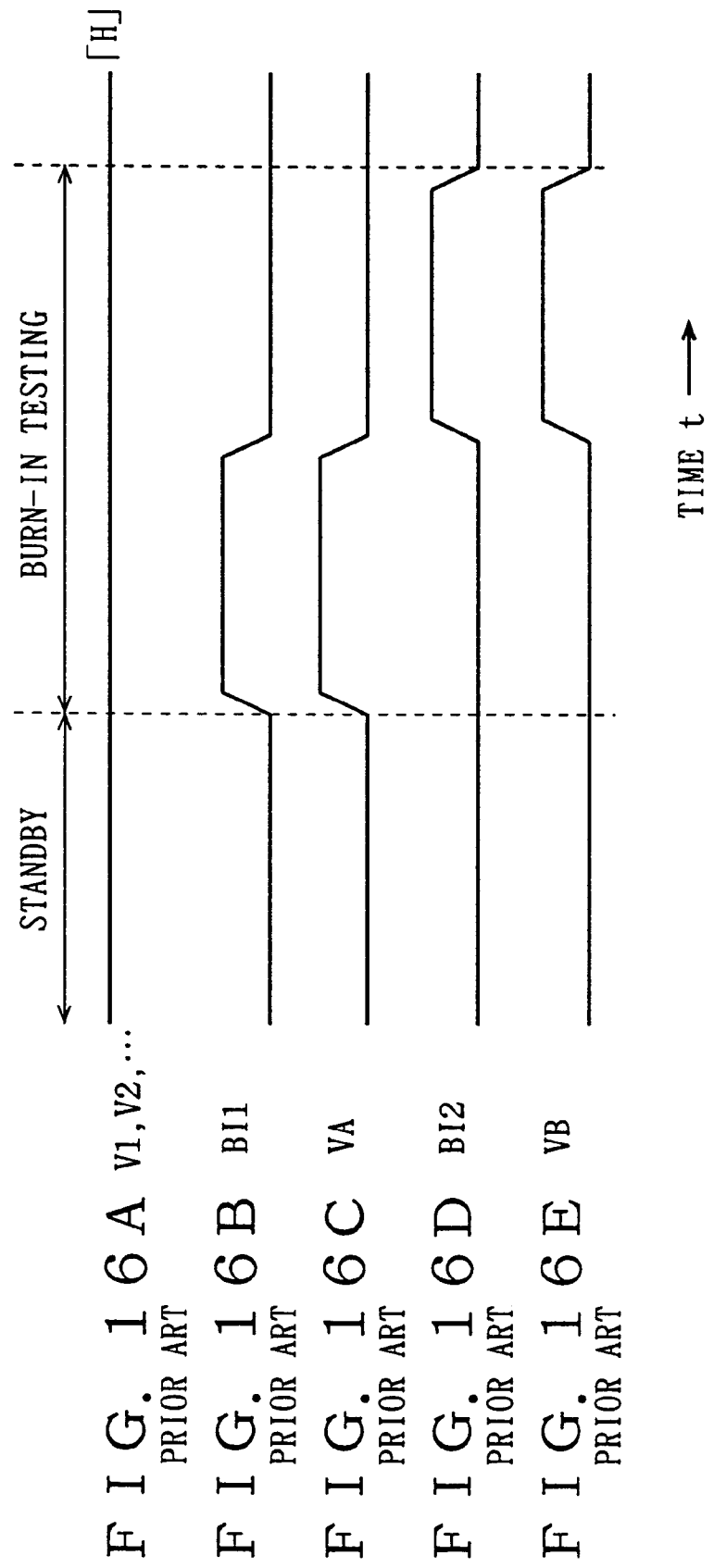

SEMICONDUCTOR MEMORY DEVICE HAVING TEST MODE

BACKGROUND OF THE INVENTION

1. Field of the Invention

The present invention relates to a semiconductor memory device and particularly to a semiconductor memory device with a test mode.

2. Description of the Background Art

FIG. 7 is a plan view of a layout of a chip for a conventional dynamic random access memory (referred to as a DRAM hereinafter).

Referring to FIG. 7, the DRAM includes four memory mats 10 each provided at one of four corners of the memory chip, a row decoder 11 and a column decoder 12 provided for each memory mat 10, and a peripheral circuit region 13 provided at the center of the memory chip. Each memory mat 10 includes a plurality of memory arrays MA1–MA16 and a plurality of sense amplifier bands SA1–SA17 arranged along the direction of the longer side of the chip. Each of memory arrays MA1–MA16 and each of sense amplifier bands SA1–SA17 are alternately arranged.

Each of memory arrays MA1–MA16 includes a plurality of memory cells each for storing data of one bit. Each memory cell is arranged at a predetermined address which is determined according to row and column addresses.

Row decoder 11 is responsive to a row address signal for selecting any of memory arrays MA1–MA16 and designating any row address of the selected memory array. Column decoder 12 is responsive to a column address signal for designating any column address of memory arrays MA1–MA16.

Arranged in sense amplifier bands SA1–SA17 is a circuit for inputting/outputting data between the memory cell of the address designated by row and column decoders 11 and 12 and the outside. A circuit for controlling the entire DRAM, a power supply circuit and the like are arranged in peripheral circuitry region 13.

FIG. 8 shows in detail a configuration of the memory array MA1 and sense amplifier bands SA1 and SA2 shown in FIG. 7.

Referring to FIG. 8, memory array MA1 is configured in the so-called half-pitch cell arrangement, and includes a plurality (16 in the figure) of bit lines BL and /BL, and a pair MCP of memory cells periodically arranged at the intersection of two word lines WL and one bit line BL or /BL. Sense amplifier bands SA1 and SA2 are each provided with a plurality (four in the figure) of sense amplifier+input/output control circuits 15.

The pair MCP of memory cells includes a memory cell MC connected to one word line WL of two word lines WL and to bit line BL, and a memory cell MC connected to the other word line WL and to bit line BL, as shown in FIG. 9A. Memory cell MC includes an n-channel MOS transistor 20 for access and a capacitor 21 for storing information.

The pair MCP of memory cells is practically formed on a surface of a p silicon substrate 22, as shown in FIG. 9B. A gate electrode or word line WL is formed on a surface of p silicon substrate 22 with a gate oxide film (not shown) interposed therebetween and n$^+$ source/drain regions 23$a$, 23$b$ and 23$c$ are formed in the surface of silicon substrate 22 at one side of each of two word lines WL as well as between the two word lines WL to form two n-channel MOS transistors 20. The common source/drain region 23$c$ of the two n-channel MOS transistors 20 is connected to bit line BL, and a conductive layer 24, a dielectric layer 25 and a conductive layer 26 are deposited on the surface of each of source/drain regions 23$a$ and 23$b$ to form capacitor 21 of memory cell MC. Conductive layer 24 serves as one electrode of capacitor 21 or a storage node SN, and conductive layer 26 serves as the other electrode of capacitor 21 to receive a cell potential Vcp.

An odd-numbered bit line BL and even-numbered bit line /BL which are arranged adjacent to each other form a pair of bit lines BL and /BL. A pair MCP of memory cells is arranged at the intersection of an odd-numbered bit line BL and (4m+1)th and (4m+2)th word lines WL, wherein m represents an integer equal to or larger than zero. A pair MCP of memory cells is arranged at the intersection of an even-numbered bit lines /BL and (4m+3)th and (4m+4)th word lines WL.

Pairs of bit lines BL and /BL configured of a (4n+1)th bit line and a (4n+2)th bit line are connected to their respective sense amplifier+input/output control circuits 15 in sense amplifier band SA1, wherein n represents an integer equal to or larger than zero. Pairs of bit lines BL and /BL configured of a (4n+3)th bit line and a (4n+4)th bit line are connected to their respective sense amplifier+input/output control circuits 15 in sense amplifier band SA2. Each sense amplifier+input/output control circuit 15 in sense amplifier bands SA1 and SA2 receives a precharge potential VBL (=Vcc/2).

Sense amplifier+input/output control circuit 15 in sense amplifier band SA2 includes transfer gates 30 and 34, a column select gate 31, a sense amplifier 32 and an equalizer 33, as shown in FIG. 10.

Transfer gate 30 includes n-channel MOS transistors 41 and 42. N-channel MOS transistors 41 and 42 are connected between input/output nodes N1 and N2 of sense amplifier+input/output control circuit 15 and a corresponding pair of bit lines BL and /BL of memory array MA2, respectively, and the gates of n-channel MOS transistors 41 and 42 receive a memory array select signal BLIR.

Transfer gate 34 includes n-channel MOS transistors 52 and 53. N-channel MOS transistors 52 and 53 are connected between input/output nodes N1 and N2 and a corresponding pair of bit lines BL and /BL of memory array MA1, respectively, and the gates of n-channel MOS transistors 52 and 53 receive a memory array select signal BLIL. Sense amplifier+input/output control circuit 15 in sense amplifier band SA2 is shared by two memory arrays MA1 and MA2 arranged on the both sides of the sense amplifier+input/output control circuit 15. When memory array MA1 is selected, signal BLIR attains a low level and transfer gate 30 is shut down. When memory array MA2 is selected, signal BLIL attains a low level and transfer gate 34 is shut down.

Column select gate 31 includes n-channel MOS transistors 43 and 44 connected between input/output nodes N1 and N2 and signal input/output lines IO and /IO, respectively. The gates of n-channel MOS transistors 43 and 44 are connected to column decoder 12 via a column select line CSL. When column decoder 12 causes column select line CSL to rise to a high level as the selected level, n-channel MOS transistors 43 and 44 are turned on and input/output nodes N1 and N2, that is, the pair of bit lines BL and /BL of memory array MA1 or MA2 are coupled with the pair of data signal input/output lines IO and /IO.

Sense amplifier 32 includes p-channel MOS transistors 45 and 46 connected between input/output nodes N1 and N2 and a node N3, respectively, and also includes n-channel MOS transistors 47 and 48 connected between input/output nodes N1 and N2 and a node N4, respectively. The gates of MOS transistors 45 and 47 are both connected to node N2, and the gates of MOS transistors 46 and 48 are both connected to node N1. Nodes N3 and N4 receive sense amplifier activating signals SE and /SE, respectively. When sense amplifier activating signals SE and /SE attain a high level and a low level, respectively, sense amplifier 32 responsively amplifies a slight, potential difference between nodes N1 and N2, i.e., between paired bit lines BL and /BL of memory array MA1 or MA2 to the power supply voltage Vcc.

Equalizer 33 includes an n-channel MOS transistor 49 connected between input/output nodes N1 and N2, and n-channel MOS transistors 50 and 51 connected between input/output nodes N1 and N2 and a node N6, respectively. The gates of n-channel MOS transistors 49–51 are all connected to node N5. Node N5 receives a bit line equalization signal BLEQ, and node N6 receives precharge potential VBL (=Vcc/2). When bit line equalization signal BLEQ attains an active high level, equalizer 33 responsively equalizes the potentials of nodes N1 and N2, i.e., the potentials of bit lines BL and /BL of memory array MA1 or MA2 with precharge potential VBL. It should be noted that signals BLIR, BLIL, SE, ISE and BLEQ and precharge potential VBL are provided from a circuit in peripheral circuitry region 13 shown in FIG. 7.

The other memory arrays MA2–MA16 and sense amplifier bands SA3–SA17 also have the same structure.

An operation of the DRAM shown in FIGS. 7–10 will now be described briefly. On standby, signals BLIR, BLIL and BLEQ all attain a high level, signals SE and /SE both attain an intermediate level (Vcc/2), and the potentials of bit lines BL and /BL are equalized with precharge potential VBL. Word line WL and column select line CSL each attain a low level as the non-selected level.

In the write mode, bit line equalization signal BLEQ initially falls to a low level to stop the equalization between bit lines BL and /BL. Then, in response to a row address signal, row decoder 11 selects, for example, memory array MA1 and sets signals BLIR and BLIL to low and high levels, respectively, to couple memory array MA1 with sense amplifier bands SA1 and SA2. Furthermore, row decoder 11 causes the word line WL of the row corresponding to the row address signal to rise to a high level as the selected level and turn on n-channel MOS transistors 20 of memory cells MC of the row.

Then, column decoder 12 causes column select line CSL for the column corresponding to a column address signal to rise to an active high level and turn on column select gate 31. Write data externally applied is provided to the pair of bit lines BL and /BL of the selected column via the pair of data input/output lines IO and /IO. The write data is provided as a potential difference between bit lines BL and /BL. Capacitor 21 of the selected memory cell MC stores therein the amount of an electrical charge corresponding to the potential of bit line BL or /BL.

In the read mode, bit line equalization signal BLEQ initially falls to a low level and the equalization between bit lines BL and /BL is stopped. As is in the write mode, row decoder 21 selects, for example, memory array MA1 and couples memory array MA1 with sense amplifier bands SA1 and SA2 as well as causes the word line WL of the row corresponding to a row address signal to rise to a high level as the selected level. The potentials of bit lines BL and /BL slightly change depending on the amount of electrical charge stored in capacitor 21 of the activated memory cell MC.

Then, sense amplifier activating signals SE and /SE attain high and low levels, respectively, to activate sense amplifier 32. When the potential of bit line BL is slightly higher than that of bit line /BL, the resistance values of MOS transistors 45 and 48 are smaller than those of MOS transistors 46 and 47, respectively, and the potential of bit line BL is increased to high level and the potential of bit line /BL is reduced to low level. When the potential of bit line /BL is slightly higher than that of bit line BL, the resistance values of MOS transistors 46 and 47 are smaller than those of MOS transistors 45 and 48, respectively, and the potential of bit lines /BL is increased to high level and the potential of bit line BL is reduced to low level.

Then, column decoder 12 causes column select line CSL of the column corresponding to a column address signal to rise to a high level as the selected level to turn on column select gate 31 of the column. The data on the pair of bit lines BL and /BL of the selected column is externally output via column select gate 31 and the pair of data signal input/output lines IO and /IO.

FIG. 11 shows the main portion of another conventional DRAM in comparison with that shown in FIG. 8. The DRAM shown in FIG. 11 is configured in a so-called quarter-pitch cell arrangement.

More specifically, (4n+1)th and (4n+3)th bit lines configure a pair of bit lines BL and /BL, and (4n+2)th and (4n+4)th bit lines configure a pair of bit lines BL and /BL. A pair MCP of memory cells is arranged at the intersection of a (4n+1)th bit line and (4m+1)th and (4m+2)th word lines. A pair MCP of memory cells is arranged at the intersection of a (4n+2)th bit line and (4m+2)th and (4m+3)th word lines. A pair MCP of memory cells is arranged at the intersection of a (4n+3)th bit line and (4m+3)th and (4m+4)th word lines. A pair MCP of memory cells is arranged at the intersection of a (4n+4)th bit line and (4m+4)th and (4m+5)th word lines.

Each odd-numbered pair of bit lines BL and /BL configured of (4n+1)th and (4n+3)th bit lines is connected to sense amplifier+input/output control circuit 15 in sense amplifier band SA1. Each even-numbered pair of bit lines BL and /BL configured of (4n+2)th and (4n+4)th bit lines is connected to sense amplifier+input/output control circuit 15 in sense amplifier band SA2.

The rest of the configuration and operation of the DRAM is the same as the DRAM shown in FIGS. 7–10 and thus a description thereof is not repeated.

Quarter-pitch cell arrangement is more advantageous than half-pitch cell arrangement in that laterally elongate capacitor 21 of memory cell MC can be rotated by 90° and arranged as a longitudinally elongate capacitor, as shown in FIG. 12.

In order to ensure the reliability of such a DRAM, conventionally, dynamic burn-in testing has been generally conducted by dynamically operating each chip for a long period of time (normally, several tens of hours) under a temperature and voltage stress condition higher than the normal operating condition to accelerate generation of initial failures for screening any chips with the possibility of causing initial failures in the market and thus preventing the shipment of such chips to the market.

In conventional burn-in testing, one word line WL and one column select line CSL represented by thick solid lines are selected by row decoder 11 and column decoder 12 to select one memory cell MC indicated by a circle, as shown in FIG. 13. In this burn-in testing, while electric field stress is applied between a word line WL selected by row decoder 11 a nd a word line WL adjacent thereto, the acceleration effect is small, since word lines WLs are selected one by one.

Thus, a method has been proposed which enhances acceleration effect by selecting odd-numbered word lines WL1, WL3, . . . or even-numbered word lines WL2, WL4, . . . at one time. FIGS. 14 and 15 are block circuit diagrams showing main portions of a DRAM capable of implementing such a testing method.

Referring to FIGS. 14 and 15, row decoder 11 of the DRAM includes word drivers WD1, WD2, . . . provided for word lines WL1, WL2, . . . , respectively. Each of word drivers WD1, WD2, . . . is configured of an inverter which inverts, amplifies and provides internal signals V1, V2, . . . on word lines WL1, WL2, . . . , respectively.

More specifically, odd-numbered word drivers WD1, WD3 . . . each include a p-channel MOS transistor 61 and an n-channel MOS transistor 62. P-channel MOS transistor 61 is connected between a line for a power supply potential Vcc and a corresponding word line (e.g., WL1), and has its gate receiving a corresponding internal signal (e.g., V1). N-channel MOS transistor 62 is connected between a line for a power supply potential VA and a corresponding word line (WL1 in this example), and has its gate receiving a corresponding internal signal (V1 in this example).

Even-numbered word drivers WD2, WD4, . . . each include a p-channel MOS transistor 63 and an n-channel MOS transistor 64. P-channel MOS transistor 63 is connected between a line for power supply potential Vcc and a corresponding word line (e.g., WL2), and has its gate receiving a corresponding internal signal (e.g., B2). N-channel MOS transistor 64 is connected between a line for a power supply potential VB and a corresponding word line (WL2 in this example), and has its gate receiving a corresponding internal signal (V2 in this example).

Power supply potentials VA and VB are generated in a VA generation circuit 65 and a VB generation circuit 66, respectively. When a burn-in testing signal BI1 attains an active high level, VA generation circuit 65 responsively outputs a high level (power supply potential Vcc). When burn-in testing signal B11 attains an inactive low level, VA generation circuit 65 responsively outputs a low level (a ground potential GND). When a burn-in testing signal BI2 attains an active high level, VB generation circuit 66 responsively outputs a high level. When burn-in testing signal BI2 attains an inactive low level, VB generation circuit 66 outputs a low level.

An operation of the DRAM shown in FIGS. 14 and 15 will briefly be described.

As shown in FIGS. 16A–16E, at standby, burn-in test signals BI1 and BI2 both attain an inactive low level and power supply potentials VA and VB both attain ground potential GND. Furthermore, internal signals V1, V2, . . . all attain a high level and word lines WL1, WL2, . . . all attain ground potential GND.

In burn-in testing, only burn-in testing signal BI1 of burn-in testing signals BI1 and BI2 attains an active high level, and only power supply potential VA of power supply potentials VA and VB attains a high level. Thus, odd-numbered word lines WL1, WL3, . . . attain a high level and even-numbered word lines WL2, WL4, . . . attain a low level, and thus electric field stress is simultaneously applied between word lines and those adjacent thereto.

Then, only burn-in testing signal BI2 of burn-in testing signals BI1 and BI2 attains an active high level and only power supply potential VB of power supply potentials VA and VB attains a high level. Thus, even-numbered word lines WL2, WL4, . . . attain a high level and odd-numbered word lines WL1, WL3, . . . attain a low level, and thus electric field stress in the inverted direction is simultaneously applied between word lines and those adjacent thereto.

The acceleration effect of conventional burn-in testing is, however, not satisfactory.

SUMMARY OF THE INVENTION

Therefore, a main object of the present invention contemplates a semiconductor memory device capable of sufficiently accelerating initial failures in burn-in testing.

Briefly describing the present invention, a first, bit-line potential inputting node of a first equalizer provided for each odd-numbered pair of bit lines is provided separately from a second, bit-line potential inputting node of a second equalizer provided for each even-numbered pair of bit lines, and the first and second nodes receive first and second testing potentials in the test mode, respectively, via a first potential supply circuit. Thus, electric field stress can be simultaneously applied between pairs of bit lines and the pairs adjacent thereto and the generation of initial failures in a semiconductor memory device can be sufficiently accelerated. This allows efficient elimination of semiconductor memory devices which cause initial failures and thus ensures the reliability of semiconductor memory devices.

The memory array is preferably structured in half-pitch cell arrangement. In this example, electric field stress can be applied between a (2n+2)th bit line and a (2n+3)th bit line.

Still preferably, the memory array is structured in quarter-pitch cell arrangement. In this example, electric field stress can be applied between adjacent bit lines.

Still preferably, the first potential supply circuit includes first and second pads for receiving the first and second testing potentials, respectively, and a switch circuit for connecting the first and second nodes to the first and second pads in the test mode, respectively. In this example, any testing potential can readily be applied.

Still preferably, the first and second testing potentials are a power supply potential and a ground potential, respectively, and the first potential supply circuit includes a first switch circuit for selectively applying the power supply potential or the ground potential to the first node in the test mode and a second switch circuit for selectively applying the power supply potential or the ground potential to the second node in the test mode. In this example, the power supply potential and ground potential need only be applied to the semiconductor memory device, and the first and second testing potentials need not further be applied.

Still preferably, a first word driver provided for an odd-numbered word line for connecting the corresponding word line to a third node in the test mode, a second word driver provided for each even-numbered word line for connecting the corresponding word line to a fourth node in the test mode, and a second potential supply circuit for supplying a select potential to one of the third and fourth nodes and a non-select potential to the other of the third and fourth nodes in the test mode are provided. In this example, the first testing potential can be written to one of two adjacent memory cells and the second testing potential can be written to the other of the two adjacent memory cells, and electric field stress can thus be applied between two adjacent memory cells.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16A–16E is a time chart for illustrating an operation of the circuits shown in FIGS. 14, 15A and 15B.

DESCRIPTION OF THE PREFERRED EMBODIMENTS

First Embodiment

Figure 1:
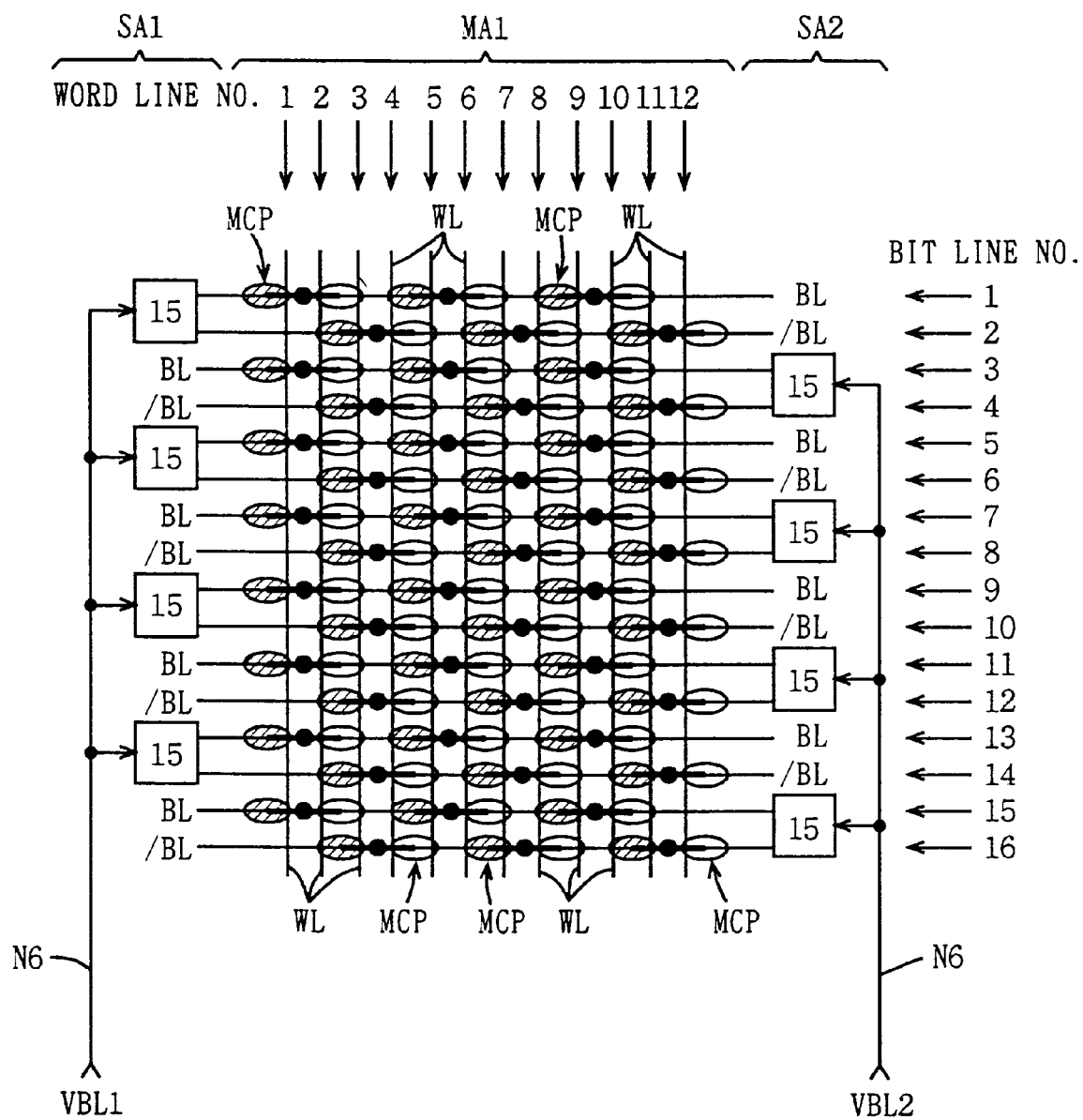
FIG. 1 is a block circuit diagram showing a configuration of memory array MA1 and sense amplifier bands SA1 and SA2 of a DRAM according to a first embodiment of the present invention.
Figure 8:
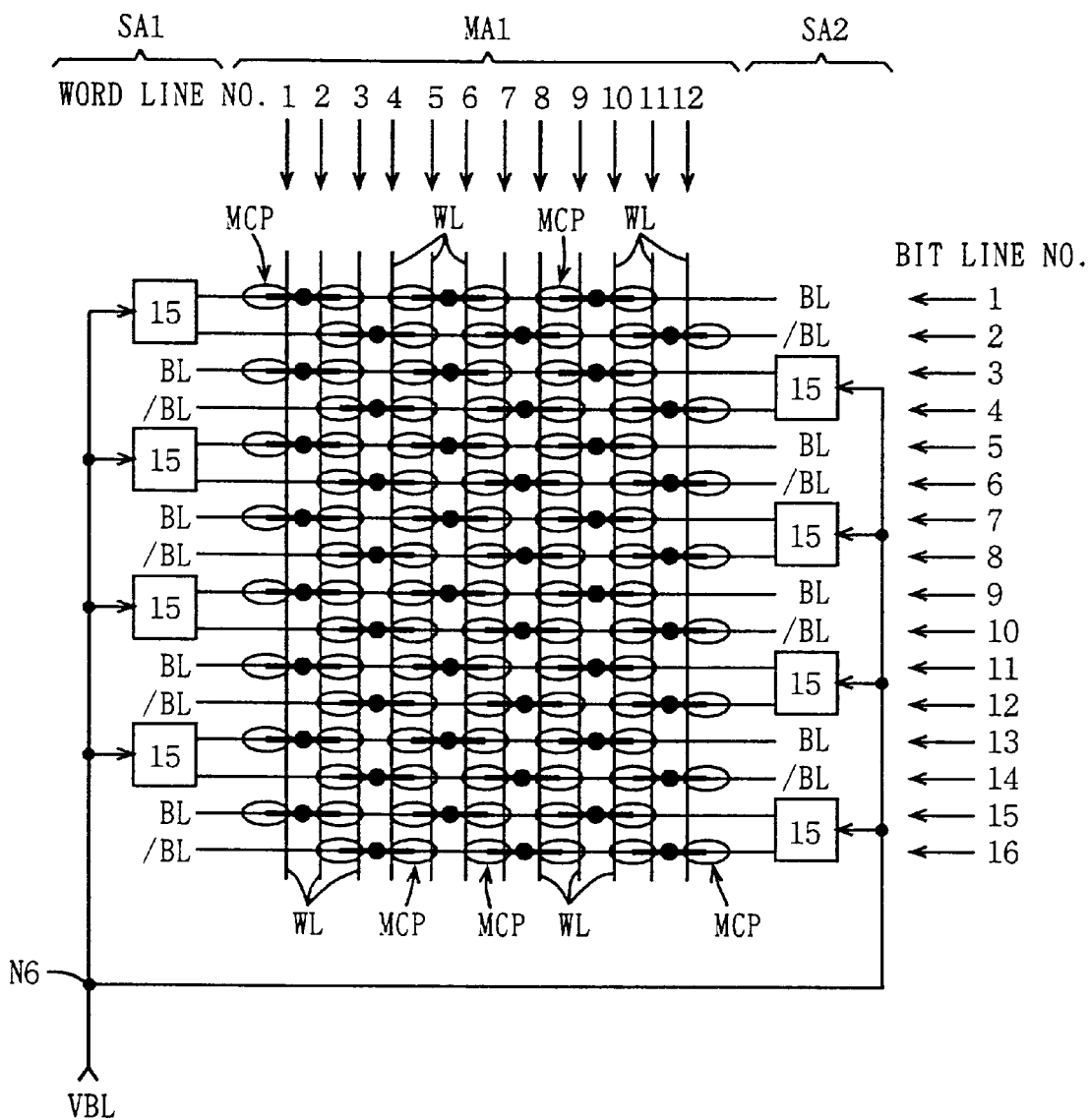
FIG. 8 is a block circuit diagram showing a configuration of memory array MA1 and sense amplifier bands SA1 and SA2 of the DRAM shown in FIG. 7.
Figure 9A:
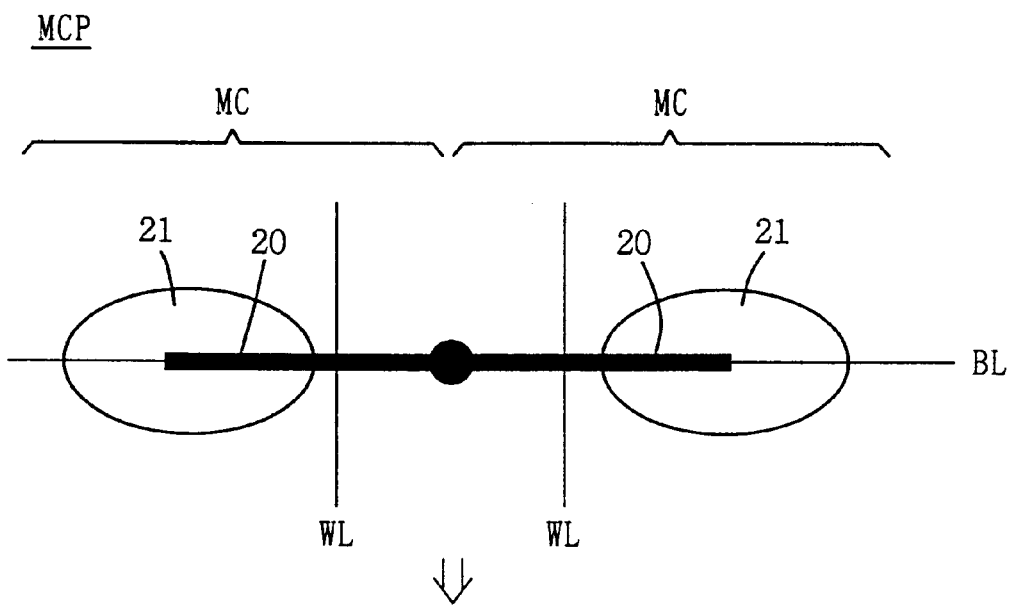
FIGS. 9A and 9B show a configuration of a pair MCP of memory cells shown in FIG. 8.
Figure 9B:
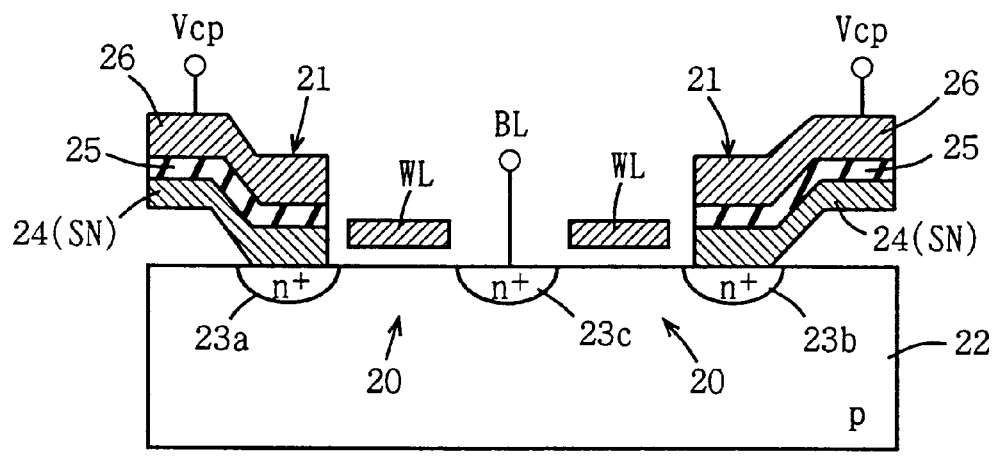
Figure 10:
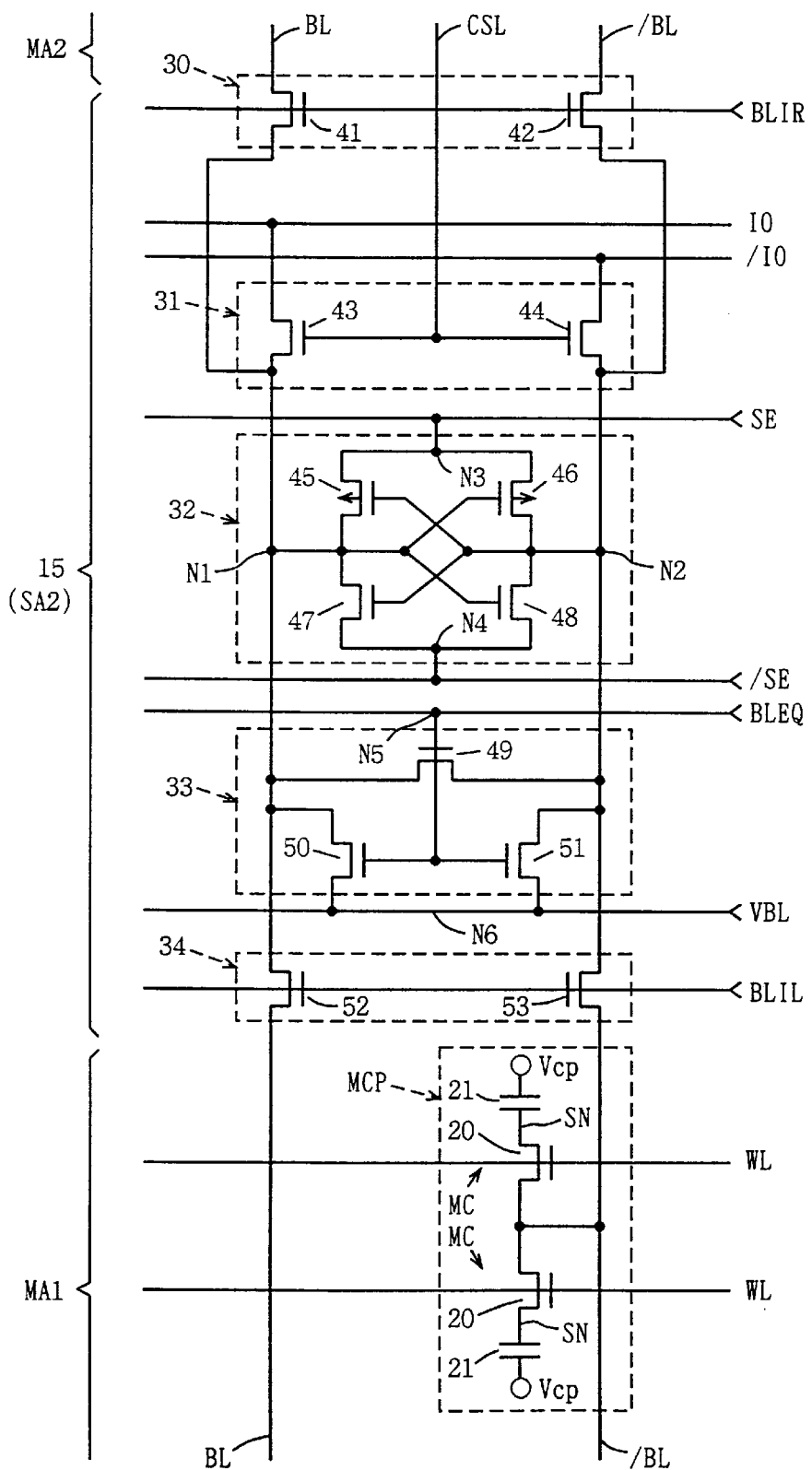
FIG. 10 is a circuit diagram showing a configuration of the sense amplifier+input/output control circuit 15 shown in FIG. 8.
Figure 11:
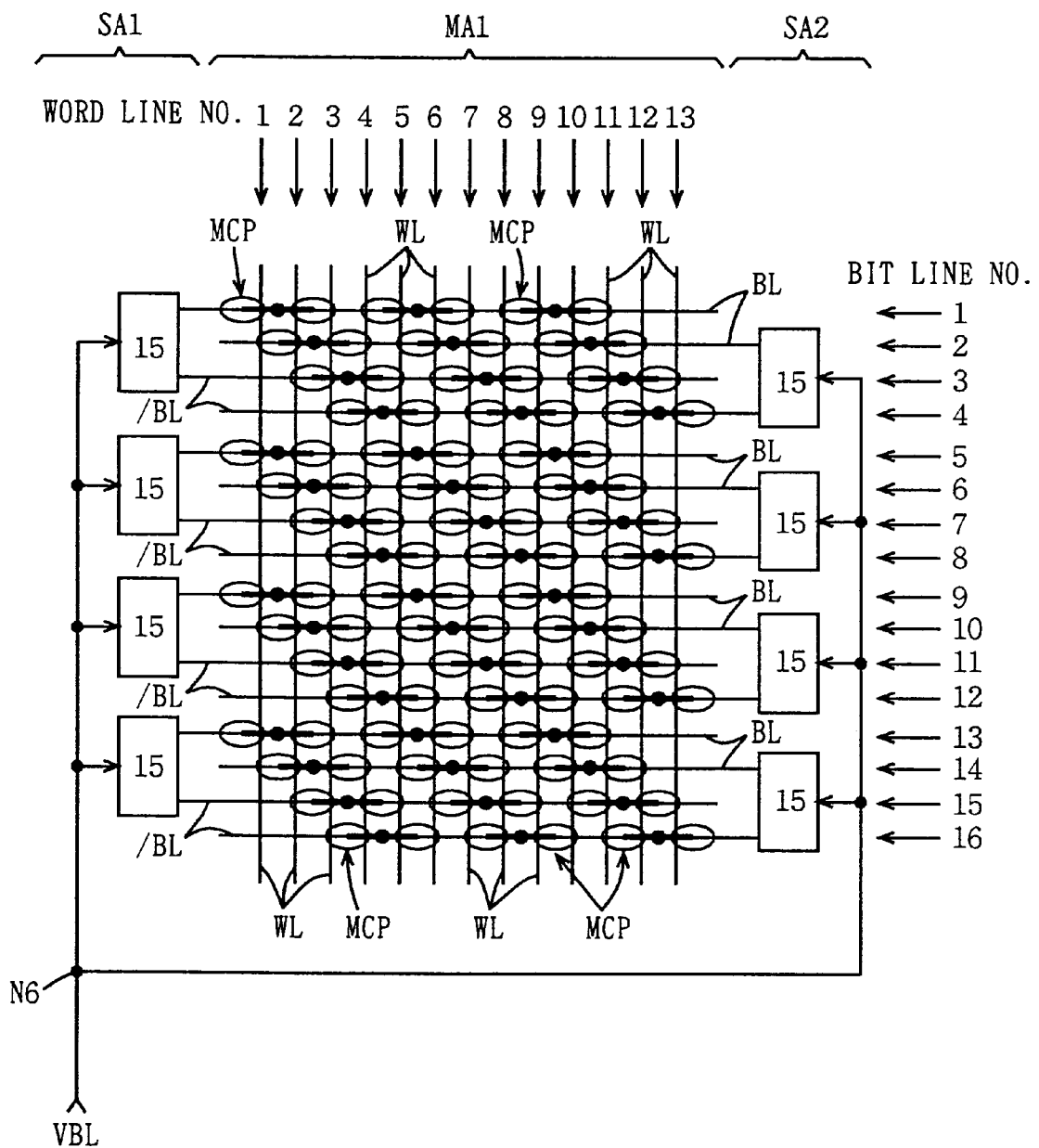
FIG. 11 is a block circuit diagram showing another conventional configuration of memory array MA1 and sense amplifier bands SA1 and SA2 of a DRAM.
Figure 12:
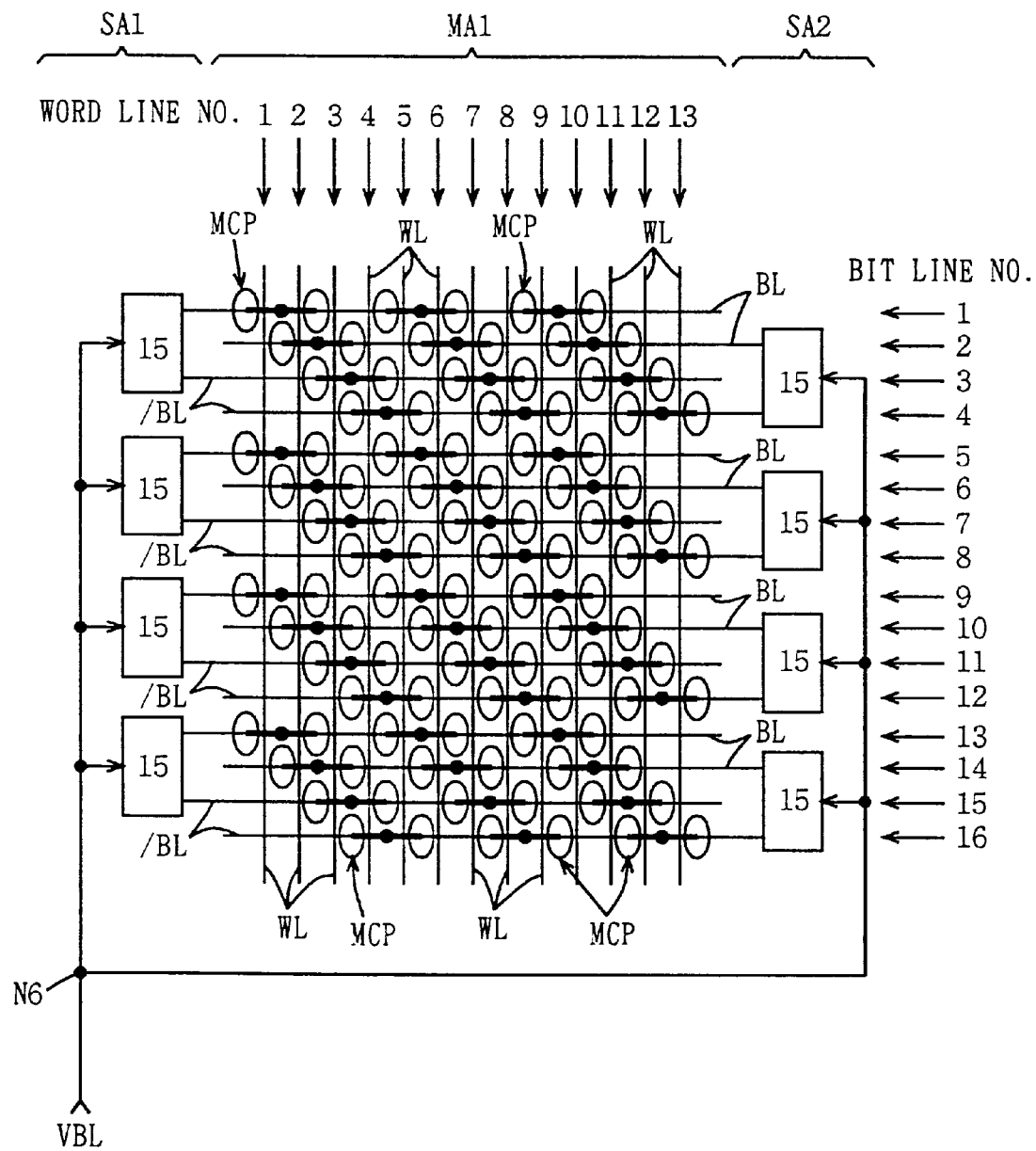
FIG. 12 is a block circuit diagram showing an improved example of the DRAM shown in FIG. 11.
Figure 13:
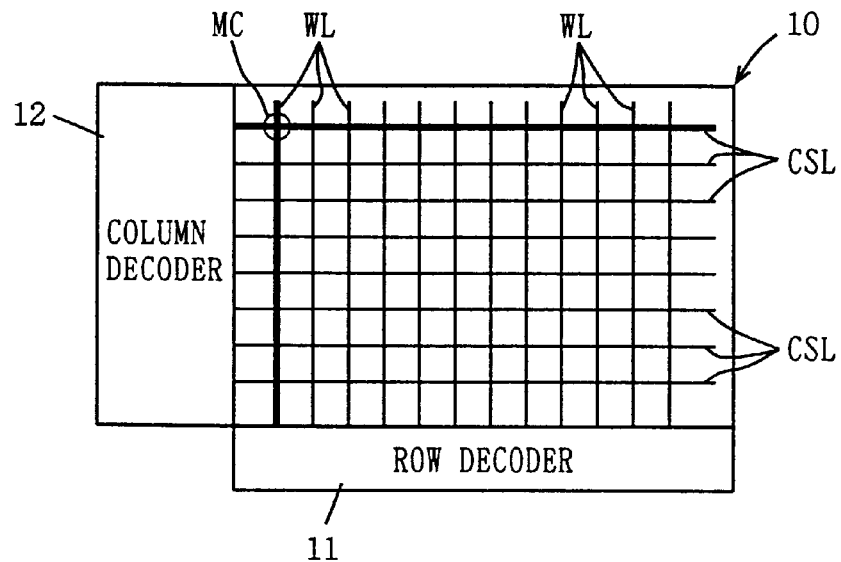
FIG. 13 is a figure for illustrating a conventional DRAM burn-in testing method and a disadvantage thereof.
Figure 14:
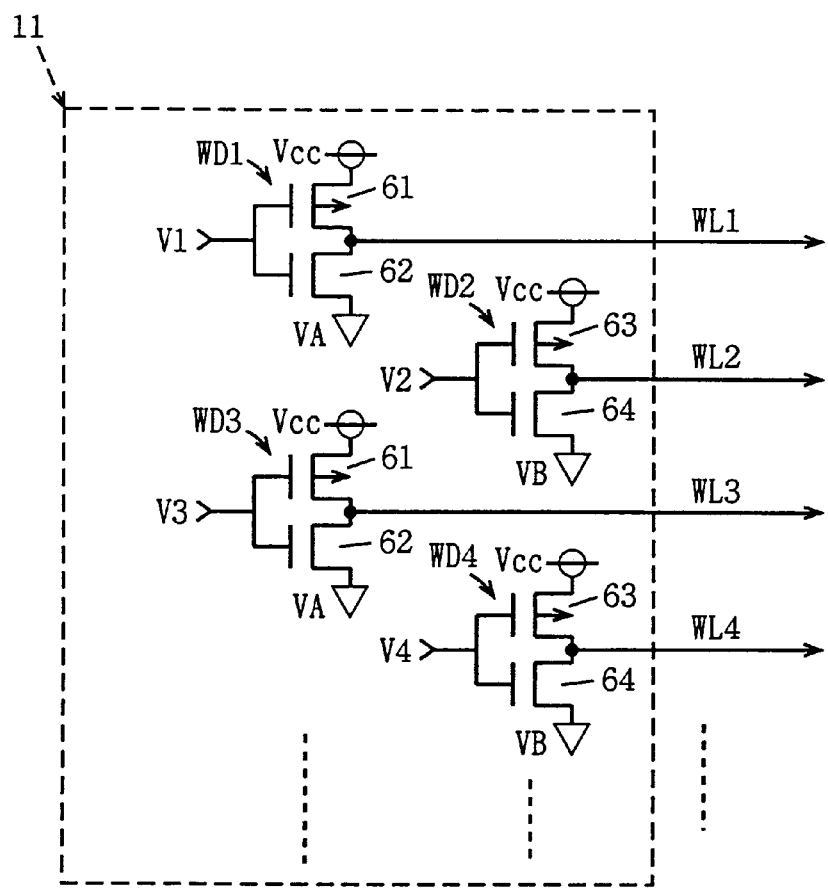
FIG. 14 is a circuit diagram for illustrating another conventional burn-in testing method.
Figure 15A:
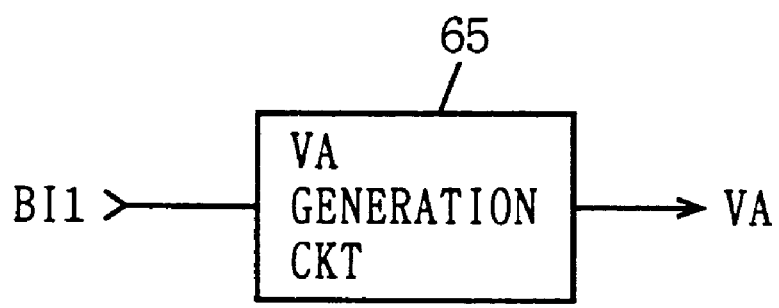
FIGS. 15A and 15B are block diagrams for illustrating power supply potentials VA and VB shown in FIG. 14.
Figure 15B:
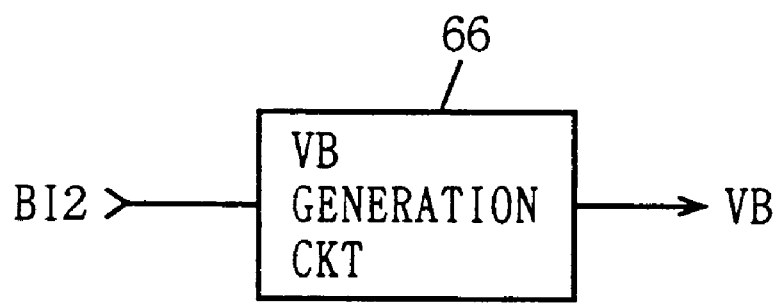

FIG. 1 shows a configuration of a main portion of a DRAM according to a first embodiment of the present invention, compared with that shown in FIG. 8.

Referring to FIG. 1, the DRAM differs from conventional DRAMs in that a node N6 (shown in FIG. 8) of an equalizer 33 of odd-numbered sense amplifier bands SA1, SA3, . . . is provided separately from node N6 of equalizer 33 of even-numbered sense amplifier bands SA2, SA4, . . . , and that they can receive different, bit-line potentials VBL1 and VBL2, respectively.

Figure 2:
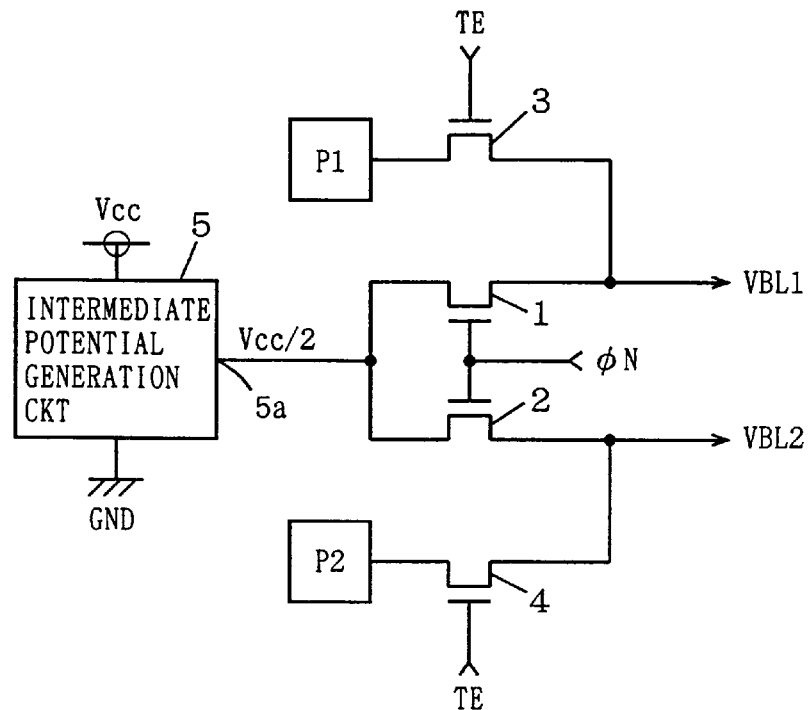
FIG. 2 is a block circuit diagram showing a configuration of a circuit for supplying bit-line potentials VBL1 and VBL2 to sense amplifier bands SA1 and SA2 shown in FIG. 1.

As shown in FIG. 2, node N6 of equalizer 33 of odd-numbered sense amplifier bands SA1, SA3, . . . is connected to an output node 5a of an intermediate potential generation circuit 5 via an n-channel MOS transistor 1 and also to a pad P1 via an n-channel MOS transistors 3. Node N6 of equalizer 33 of even-numbered sense amplifier bands SA2, SA4, . . . is connected to output node 5a of intermediate potential generation circuit 5 via an n-channel MOS transistor 2 and also to a pad P2 via an n-channel MOS transistor 4. Intermediate potential generation circuit 5 receives power supply potential Vcc and ground potential GND and outputs the intermediate potential (precharge potential) Vcc/2 therebetween. The gates of n-channel MOS transistors 1 and 2 receive a normal operation signal φN, and the gates of n-channel MOS transistors 3 and 4 receive a testing signal TE.

An operation of the DRAM will now be briefly described. In the normal mode of operation, normal operation signal φN attains an active high level to turn on n-channel MOS transistors 1 and 2 and testing signal TE attains an inactive low level to turn off n-channel MOS transistors 3 and 4. Thus, node N6 of equalizer 33 of odd-numbered sense amplifier bands SA1, SA3, . . . and node N6 of equalizer 33 of even-numbered sense amplifier bands SA2, SA4, . . . are both connected to output node 5a of intermediate voltage generation circuit 5 and receive precharge potential Vcc/2. The operation in the normal mode of operation is conventionally performed.

In burn-in testing, normal operation signal φN attains an inactive low level to turn off n-channel MOS transistors 1 and 2 and testing signal TE attains an active high level to turn on n-channel MOS transistors 3 and 4. Thus, node NG of equalizer 33 of odd-numbered sense amplifier bands SA1, SA3, . . . , is connected to pad P1, and node N6 of equalizer 33 of even-numbered sense amplifier bands SA2, SA4, . . . , is connected to pad P2. Then, node NG of equalizer 33 of odd-numbered sense amplifier bands SA1, SA3 . . . externally receives a high level (e.g., 5 V when power supply potential Vcc is 3.3 V) via pad V1, and node N6 of equalizer 33 of even-numbered sense amplifier bands SA2, SA4, . . . externally receives a low level (0 V) from pad P2.

Thus, the potentials of the bit lines shown in FIG. 1 are 5 V, 5 V, 0 V, 0 V, 5 V, 5 V, 0 V, 0 V, . . . respectively, and electric field stress is simultaneously applied between the (2n+2)th bit lines /BL and the (2n+3)th bit lines BL. Furthermore, pads P1 and P2 can receive a low level and a high level, respectively, to apply electric field stress in the inverted direction.

Furthermore, bit-line potentials VBL1 and VBL2 can both be set to a high level to select odd-numbered word lines WL1, WL3, . . . and bit-line potentials VBL1 and VBL2 can both be set to a low level to select even-numbered word lines WL2, WL4, . . . , so that a high level is written to storage node SN of the hatched memory cells MC in FIG. 1 and a low level can be written to storage node SN of the other memory cells. As shown in FIG. 1, the memory cells MC to which a high level is written and the memory cells MC to which a low level is written form a staggered pattern.

According to this method, electric field stress can be applied between adjacent memory cells MC. Furthermore, when bit-line potentials VBL1 and VBL2 are both set to a low level to select odd-numbered word lines WL1, WL3, . . . and bit-line potentials VBL1 and VBL2 are both set to a high level to select even-numbered word lines WL2, WL4, . . . , the direction of electric field stress can be inverted.

In the present embodiment, two adjacent pairs of bit lines can receive different, bit-line potentials VBL1 and VBL2, respectively, so that initial failures of DRAM chips can be sufficiently accelerated using the aforementioned method. This efficiently eliminates defective DRAM chips and thus ensures the reliability of DRAM chips.

It is needless to say that n-channel MOS transistors 1–4 used for connection between output node 5a of intermediate potential generation circuit 5 and pads P1 and P2, and node N6 of equalizer 33 may be substituted by p-channel MOS transistors. It should be noted, however, that the inverted versions of signals TE and φN should be input to the gates of the p-channel MOS transistors.

For n-channel MOS transistors, when power supply potential Vcc is applied to pads P1 and P2, node N6 of equalizer 33 can only receive a potential Vcc-Vth, a potential lower than power supply potential Vcc by a threshold voltage Vthn of an n-channel MOS transistor. By contrast, with p-channel MOS transistors, power supply voltage Vcc applied to pads P1 and P2 can be transparently transmitted to node N6 of equalizer 33.

On the contrary, node N6 of equalizer 33 can transparently receive ground potential GND applied to pads P1 and P2 when n-channel MOS transistors are used, whereas node N6 of equalizer 33 can only receive a potential GND+Vthp, a potential higher than ground potential GND by a threshold voltage Vthp of a p-channel MOS transistor when p-channel MOS transistors are used.

It is also needless to say that each of n-channel MOS transistors 1–4 may be substituted by a transfer gate configured of a parallel connection of n- and p-channel MOS transistors. It should be noted, however, that the gate of the n-channel MOS transistor of the transfer gate should receive signals TE and φn and the gate of the p-channel MOS transistor of the transfer gate should receive the inverted versions of signals TE and φN. With the transfer gate, power supply voltage Vcc and ground voltage GND applied to pads P1 and P2 can be transparently transmitted to node N6 of equalizer 33.

Second Embodiment

Figure 3:
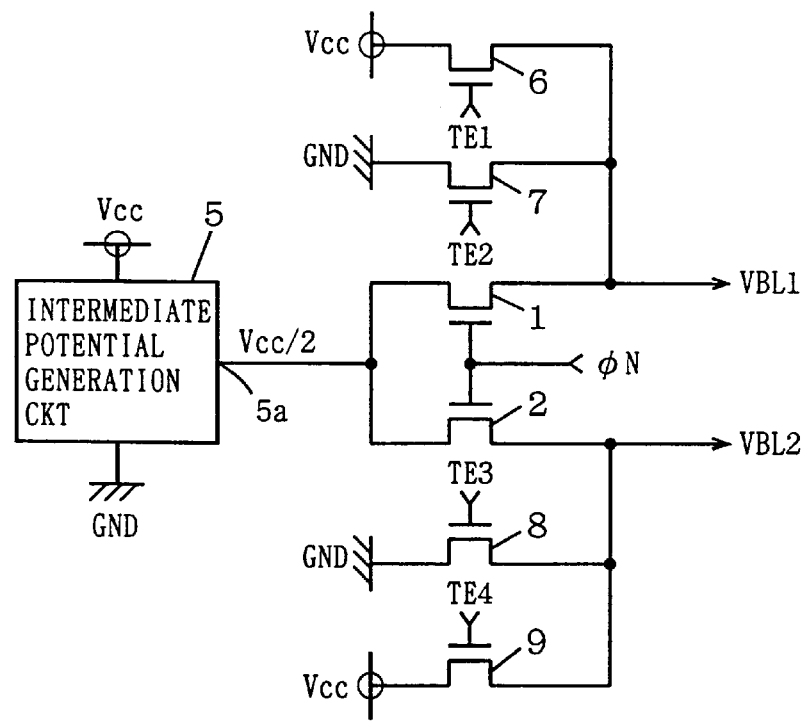
FIG. 3 is a block circuit diagram showing a configuration of a circuit for supplying bit-line potentials VBL1 and VBL2 in a DRAM according to a second embodiment of the present invention.

FIG. 3 is a block circuit diagram showing a main portion of a DRAM according to a second embodiment of the present invention, compared with that shown in FIG. 2.

Referring to FIG. 3, the DRAM differs from the DRAM according to the first embodiment in that n-channel MOS transistors 3 and 4 and pads P1 and P2 are replaced with n-channel MOS transistors 6–9.

N-channel MOS transistor 6 is connected between a line for power supply potential Vcc and node N6 of equalizer 33 of odd-numbered sense amplifier bands SA1, SA3, . . . and n-channel MOS transistor 7 is connected between a line for ground potential GND and node N6 of equalizer 33 of odd-numbered sense amplifier bands SA1, SA3, . . . , and the gates of n-channel MOS transistors 6 and 7 receive testing signals TE1 and TE2, respectively.

N-channel MOS transistor 8 is connected between a line for ground potential GND and node N6 of equalizer 33 of even-numbered sense amplifier bands SA2, SA4, . . . and n-channel MOS transistor 9 is connected between a line for power supply potential Vcc and node N6 of equalizer 33 of even-numbered sense amplifier bands SA2, SA4, . . . , and the gates of n-channel MOS transistors 8 and 9 receive testing signals TE3 and TE4, respectively.

An operation of the DRAM will now be described briefly. In the normal mode of operation, normal operation signal φN attains an active high level to turn on n-channel MOS transistors 1 and 2 and testing signals TE1–TE4 all attain an inactive low level to turn off n-channel MOS transistors 6–9. Thus, node N6 of equalizer 33 of odd-numbered sense amplifier bands SA1, SA3, . . . and node N6 of equalizer 33 of even-numbered sense amplifier bands SA2, SA4, . . . are both connected to output node 5a of intermediate potential generation circuit 5 and receive precharge potential Vcc/2. The operation in the normal mode of operation is conventionally performed.

In burn-in testing, normal operation signal φN attains an inactive low level to turn off n-channel MOS transistors 1 and 2, testing signal TE or TE2 attains an active high level to turn on n-channel MOS transistor 6 or 7, and testing signal TE3 or TE4 attains an active high level to turn on n-channel MOS transistor 8 or 9. Thus, node N6 of equalizer 33 of odd-numbered sense amplifier bands SA1, SA3, . . . receives power supply potential Vcc or ground potential GND, and node N6 of equalizer 33 of even-numbered sense amplifier bands SA2, SA4, . . . receives ground potential GND or power supply potential Vcc.

Other operations of the DRAM are similar to those of the DRAM according to the first embodiment and a description thereof is not repeated.

The present embodiment allows an effect similar to that of the first embodiment. Furthermore, further application of bit-line potentials VBL1 and VBL2 is not required and a testing device can be simplified.

In the present embodiment also, it is needless to say that each of n-channel MOS transistors 1, 2, 6–9 may be substituted by a p-channel MOS transistor or a transfer gate.

Third Embodiment

Figure 4:
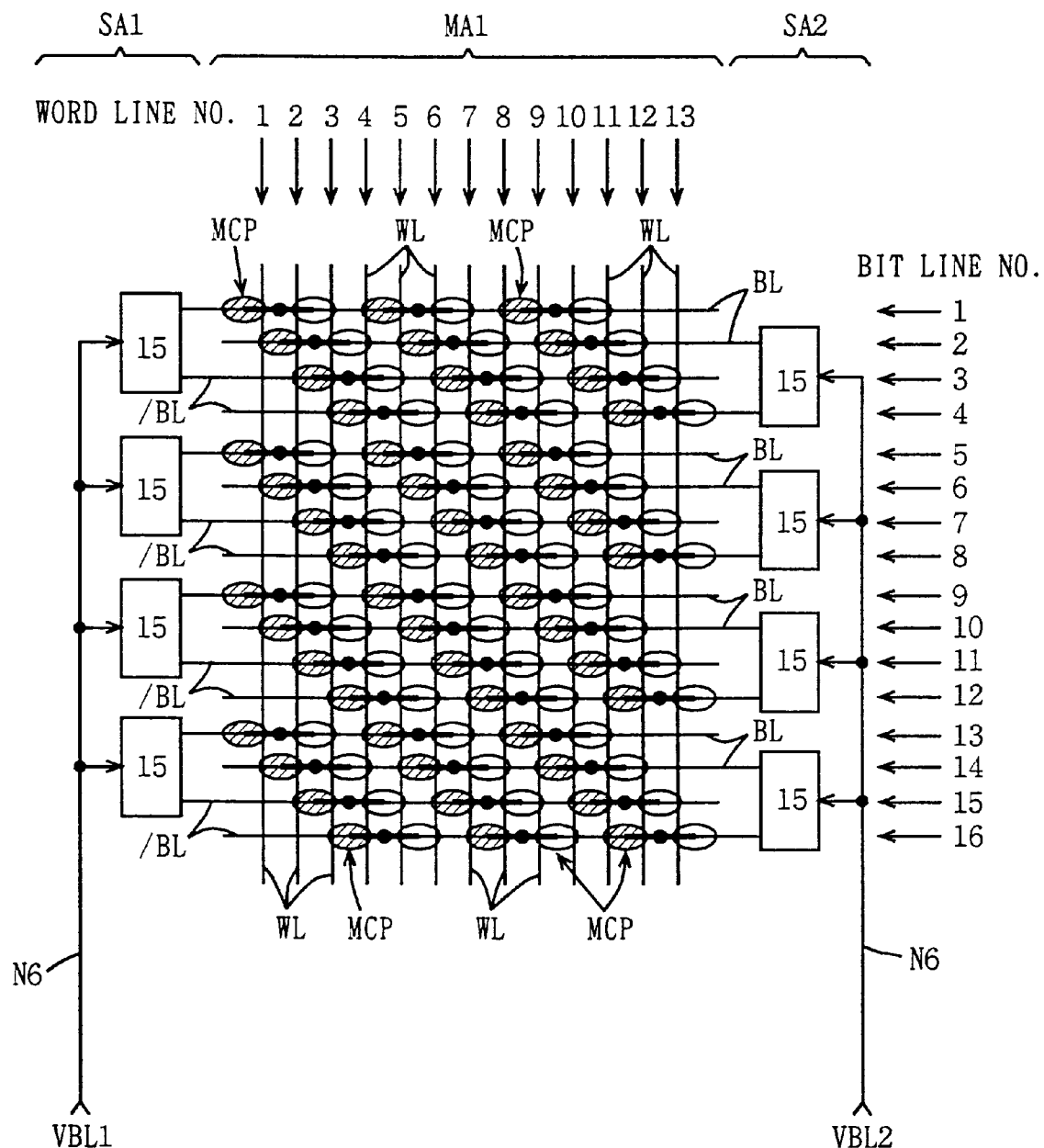
FIG. 4 is a block circuit diagram for illustrating a configuration and an operation of memory array MA1 and sense amplifier bands SA1 and SA2 in a DRAM according to a third embodiment of the present invention.

FIG. 4 shows a main portion of a DRAM according to a third embodiment of the present invention, compared with that shown in FIG. 1.

The DRAM shown in FIG. 4 differs from the DRAM according to the first embodiment in that memory arrays MA1, MA2, . . . according to the first embodiment are configured in half-pitch cell arrangement, whereas memory arrays MA1, MA2, . . . according to the present embodiment are configured in quarter-pitch cell arrangement.

An operation of the DRAM in burn-in testing will now be described briefly. First, as is in the first embodiment, equalizer 33 of sense amplifier bands SA1, SA2, . . . is disconnected from intermediate potential generation circuit 5.

Then, node N6 of equalizer 33 of odd-numbered sense amplifier bands SA1, SA2, . . . externally receives a high level (e.g., 5 V when power supply potential Vcc is 3.3 V) via pad P1 and node N6 of equalizer 33 of even-numbered sense amplifier bands SA2, SA4, . . . externally receives a low level (e.g., 0 V) via pad P2.

Thus, the potentials of the bit lines BL and /BL shown in FIG. 4 are 5 V, 0 V, 5 V, 0 V, 5 V, 0 V, . . . , respectively, and electric field stress is simultaneously applied between all adjacent bit lines BL and /BL. Thus, initial failures are accelerated more effectively than the DRAM according to the first embodiment in which electric field stress is not applied between bit lines BL and /BL which form one pair of bit lines BL and /BL. It should be noted that pads P1 and P2 can receive low and high levels, respectively, to apply electric field stress in the inverted direction.

Furthermore, as shown in Table 1, when bit-line potentials VBL1 and VBL2 are set to high and low levels, respectively, to select odd-numbered word lines WL/1, WL3, . . . and then set to low and high levels, respectively, to select even-numbered word lines WL2, WL4, respectively, a high level can be written to storage node SN of the hatched memory cells MC in FIG. 4 and a low level can be written to storage node SN of the other memory cells MC.

TABLE 1

|        | ① | ② |
|--------|---|---|
| WL1,3,... | H | L |
| WL2,4,... | L | H |
| VBL1   | H | L |
| VBL2   | L | H |

As can be seen from FIG. 4, the memory cells MC to which a high level is written and the memory cells MC to which a low level is written form a first staggered pattern.

In the relation shown in FIG. 4, however, electric field stress can be applied between each memory cell MC, and the memory cells positioned immediately thereabove, thereunder, on the right side thereof, on the left side thereof, on the upper right side thereof and the lower left side thereof but cannot be applied between each memory cell MC and the memory cells positioned immediately on the upper left side thereof and the lower right side thereof.

Figure 5:
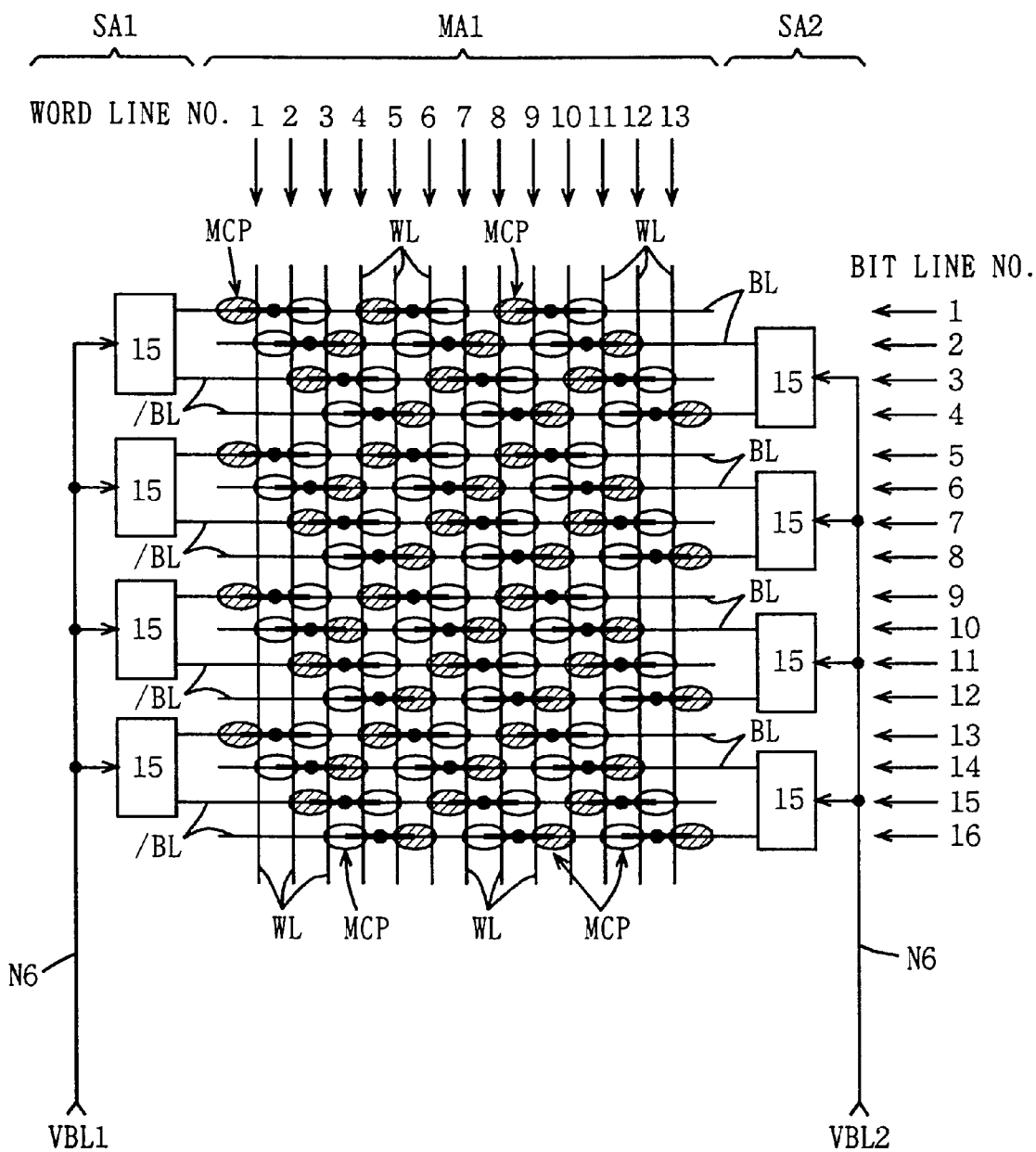
FIG. 5 is a block circuit diagram for illustrating another operation of memory array MA1 and sense amplifier bands SA1 and SA2 shown in FIG. 4.

Thus, as shown in Table 2, when bit-line potentials VBL1 and VBL2 are both set to a high level to select odd-numbered word lines WL1, WL3, . . . and then to a low level to select even-numbered word lines WL2, WL4, . . . , a high level can be written to storage node SN of the hatched memory cells MC shown in FIG. 5 and a low level can be written to storage node SN of the other memory cells MC.

TABLE 2

|  | ① | ② |
|---|---|---|
| WL1,3,... | H | L |
| WL2,4,... | L | H |
| VBL1 | H | L |
| VBL2 | H | L |

As can be seen from FIG. 4, the memory cells MC to which a high level is written and the memory cells MC to which a low level is written form a second staggered pattern, which is different from the first staggered pattern. This allows application of electric field stress between each memory cell MC and the memory cells positioned immediately on the upper left side and lower right side of each memory cell. It should be noted that the levels of bit-line potentials VBL1 and VBL2 can be inverted to apply electric field stress in the inverted direction.

Data (a high level or low level) written to a memory cell MC in a DRAM is gradually lost when the word line WL falls to a low level. Thus, it is preferable in detecting a slight short-circuit between memory cells MC that static stress (steady stress) is applied between memory cells MC while word lines WL are maintained at a high level.

When word lines WL rise to and are maintained at a high level in the condition shown in FIG. 4, however odd-number or even-numbered word lines WL are only maintained at a high level and thus static stress can only be applied between each memory cell MC and two memory cells MC of the six memory cells MC adjacent to each memory cell MC. Furthermore, when word lines WL rise to and are maintained at a high level in the condition shown in FIG. 5, static stress cannot be applied between memory cells MC, since odd-numbered or even-numbered word lines WL are only maintained at a high level and memory cells MC corresponding to the word lines WL maintained at the high level have the same data.

Figure 6:
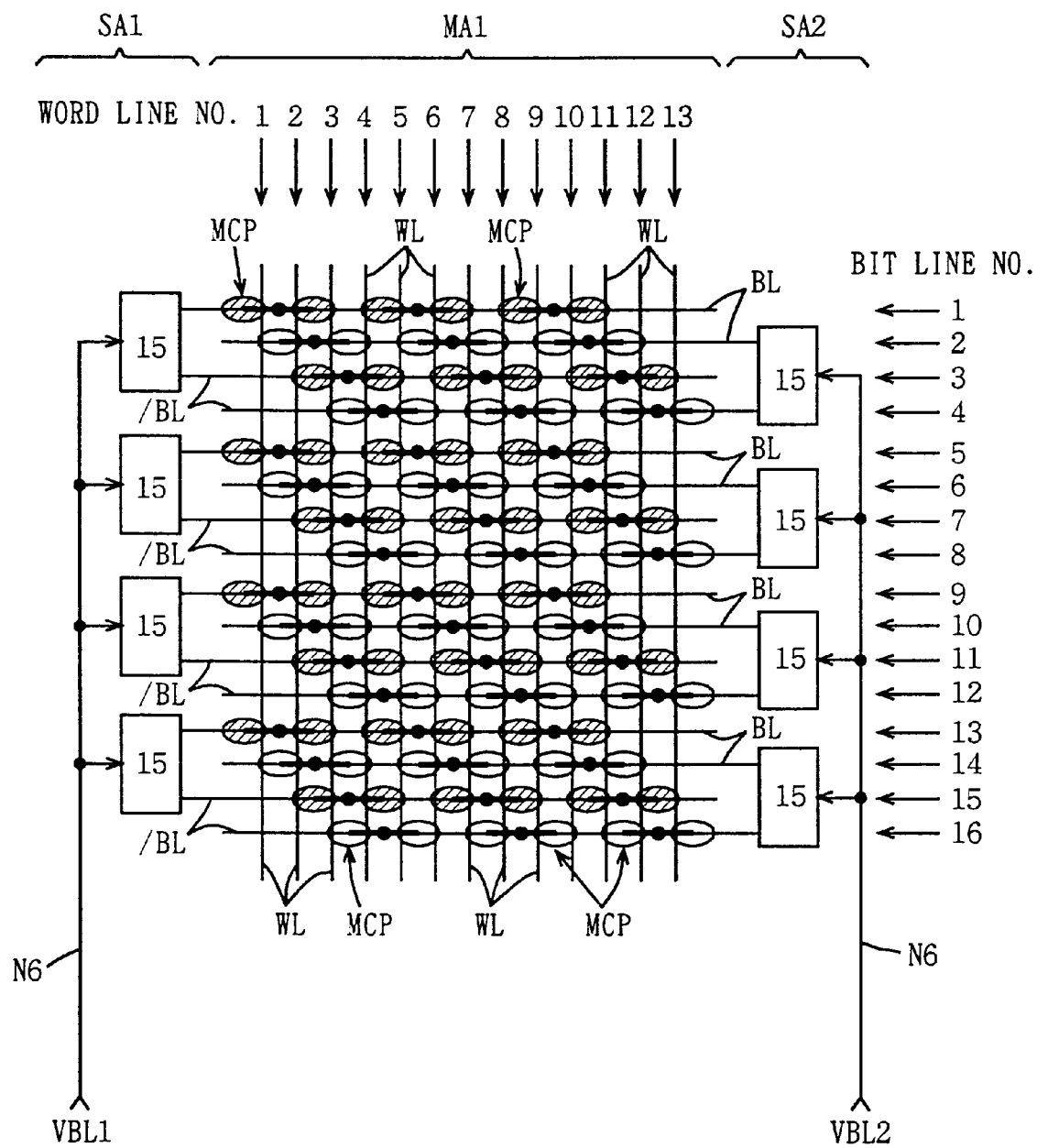
FIG. 6 is a block circuit diagram for illustrating still another operation of memory array MA1 and sense amplifier bands SA1 and SA2 shown in FIG. 4.
Figure 7:
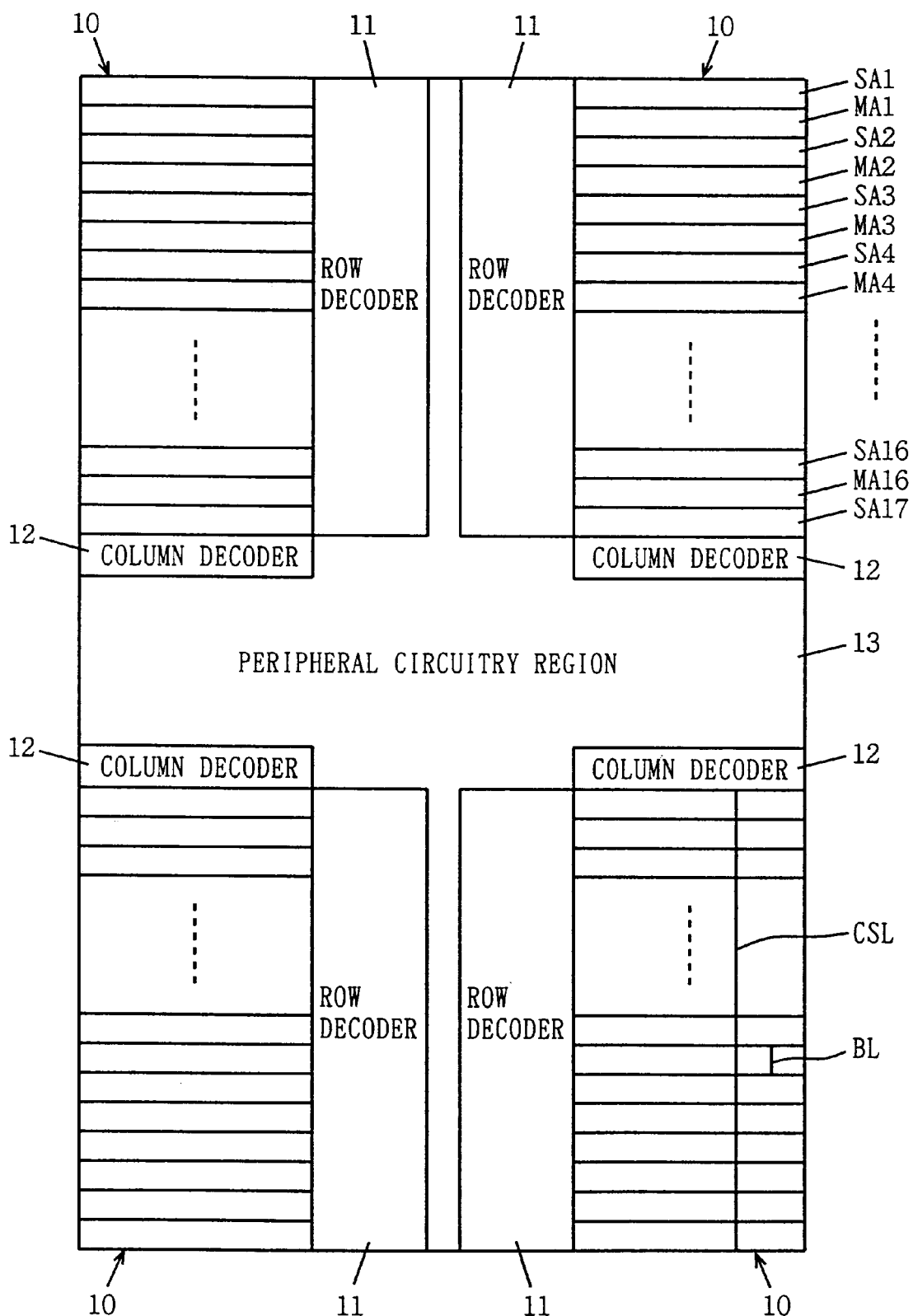
FIG. 7 shows a conventional chip layout of a DRAM.

Thus, bit-line potentials VBL1 and VBL2 are set to high and low levels, respectively, to maintain all word lines WL at a high level, as shown in FIG. 6.

As can be seen from FIG. 6, the memory cells MC which receive a high level (i.e., the hatched memory cells MC) and the memory cells MC which receive a low level form a third staggered pattern. This allows application of static stress between each memory cell MC and four memory cells MC adjacent thereto. It should be noted that the levels of bit-line potentials VBL1 and VBL2 can be inverted to apply the static stress in the inverted direction.

The present embodiment can sufficiently accelerate initial failures of DRAM chips as well as the first embodiment, and thus eliminate defective DRAM chips efficiently.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode, comprising:

a memory array including a plurality of memory cells arranged in a matrix, a word line provided for each row and a pair of bit lines provided for each column;

a first equalizer provided for each odd-numbered pair of bit lines, responsive to a bit-line equalization signal for connecting a corresponding odd-numbered pair of bit lines to a first node;

a second equalizer provided for each even-numbered pair of bit lines, responsive to said bit-line equalization signal for connecting a corresponding even-numbered pair of bit lines to a second node provided independently of said first node; and first potential supply means for supplying a precharge potential to said first and second nodes in a normal mode of operation and for supplying first and second testing potentials to said first and second nodes in said test mode, respectively.

2. The semiconductor memory device according to claim 1, wherein:

(2n+1)th and (2n+2)th bit lines of said memory array form said pair of bit lines, wherein n is an integer no less than zero; and said memory cell is arranged at each intersection of said (2n+1)th bit line and (4m+1)th and (4m+2)th word lines and at each intersection of said (2n+2)th bit line and (4m+3)th and (4m+4)th word lines, where m is an integer no less than zero.

3. The semiconductor memory device according to claim 1, wherein;

(4n+1)th and (4n+3)th bit lines of said memory array form said pair of bit lines and (4n+2)th and (4n+4)th bit lines form said pair of bit lines; and said memory cell is arranged at each intersection of said (4n+1)th bit line and (4m+1)th and (4m+2)th word lines, at each intersection of said (4n+2)th bit line and (4m+2)th and (4m+3)th word lines, at each intersection of said (4n+3)th bit line and said (4m+3)th and (4m+4)th word lines, and at each intersection of said (4n+4)th bit line and (4m+4)th and (4m+5)th word lines, where n and m are integers no less than zero.

4. The semiconductor memory device according to claim 1, wherein said first potential supply means includes:

potential generation means externally receiving a power supply potential and a ground potential and outputting said precharge potential;

first and second pads externally receiving said first and second testing potentials, respectively; and switch means for connecting said first and second nodes to an output node of said potential generation means in said normal mode of operation and connecting said first and second nodes to said first and second pads, respectively, in said test mode of operation.

5. The semiconductor memory device according to claim 1, said first and second testing potentials being a power supply potential or a ground potential externally applied, said first potential supply means includes:

potential generation means for receiving said power supply potential and said ground potential and outputting said precharge potential;

connecting means for connecting said first and second nodes to an output node of said potential generation means in said normal mode of operation;

first switch means for selectively applying one of said power supply potential and said ground potential to said first node in said test mode of operation; and second switch means for selectively applying one of said power supply potential and said ground potential to said second node in said test mode of operation.

6. A semiconductor memory device according to claim 1, further comprising:

row select means responsive to a row address signal for selecting any word line of said memory array;

a first word driver provided for each odd-numbered word line for connecting a corresponding word line to a node at a select potential to activate corresponding memory cells when said row select means selects the corresponding word line and for connecting the corresponding word line to a third node otherwise;

a second word driver provided for each even-numbered word line for connecting a corresponding word line to said node at the select potential to activate corresponding memory cells when said row select means selects the corresponding word line and for connecting the corresponding word line to a fourth node otherwise; and second potential supply means supplying a non-select potential to said third and fourth nodes in said normal mode of operation and supplying said select potential to at least one of said third and fourth nodes in said test mode of operation.

7. A semiconductor memory device having a test mode, comprising:

a plurality of memory cells arranged in a plurality of rows and a plurality of columns;

a plurality of word lines corresponding to the rows of said plurality of memory cells, respectively;

a plurality of bit line pairs corresponding to the columns of said plurality of memory cells, respectively;

a first equalizer provided for a first bit line pair of said plurality of bit line pairs, for receiving a bit-line equalization signal to connect said first bit line pair to a first node;

a second equalizer provided for a second bit line pair of said plurality of bit line pairs, for receiving said bit-line equalization signal to connect said second bit line pair to a second node, said second bit line pair having at least one bit line arranged adjacent to at least one bit line of said first bit line pair;

a normal potential supply circuit including a precharge potential generation circuit generating a precharge potential in a normal operation, for supplying said precharge potential to both said first and second nodes in said normal operation; and a test potential supply circuit for supplying first and second test potentials to said first and second nodes, respectively, in said test mode, said first and second test potentials being controlled independently of each other.

8. The semiconductor memory device according to claim 7, wherein said test potential supply circuit includes:

first and second pads externally receiving said first and second testing potentials, respectively; and a connecting circuit for connecting said first and second nodes to said first and second pads, respectively, in said test mode of operation.

9. The semiconductor memory device according to claim 7, said first and second testing potentials being a power supply potential or a ground potential externally applied, said test potential supply circuit includes:

a first switch circuit for selectively applying one of said power supply potential and said ground potential to said first node in said test mode of operation; and a second switch circuit for selectively applying one of said power supply potential and said ground potential to said second node in said test mode of operation.

10. A semiconductor memory device according to claim 7, further comprising:

a row select circuit responsive to a row address signal for selecting any word line of said plurality of word lines;

a first word driver provided for each odd-numbered word line for connecting a corresponding word line to a node at a select potential to activate corresponding memory cells when said row select circuit selects the corresponding word line and for connecting the corresponding word line to a third node otherwise;

a second word driver provided for each even-numbered word line for connecting a corresponding word line to said node at the select potential to activate corresponding memory cells when said row select circuit selects the corresponding word line and for connecting the corresponding word line to a fourth node otherwise; and a word line potential supply circuit for supplying a non-select potential to said third and fourth nodes in said normal mode of operation and for supplying said select potential to at least one of said third and fourth nodes in said test mode of operation.

* * * * *